United States Patent
Reddy Avuthu et al.

(10) Patent No.: US 12,225,822 B2
(45) Date of Patent: Feb. 11, 2025

(54) SYSTEM FOR MANUFACTURING PIEZOELECTRONICS

(71) Applicant: Jabil Inc., St. Petersburg, FL (US)

(72) Inventors: Sai Guruva Reddy Avuthu, St. Petersburg, FL (US); Mark Edward Sussman, St. Petersburg, FL (US); Thomas Victor Reidy, St. Petersburg, FL (US); Nabel M. Ghalib, St. Petersburg, FL (US); MaryAlice Gill, St. Petersburg, FL (US); Jorg Richstein, St. Petersburg, FL (US)

(73) Assignee: Jabil Inc.

( * ) Notice: Subject to any disclaimer, the term of this patent is extended or adjusted under 35 U.S.C. 154(b) by 1056 days.

(21) Appl. No.: 15/828,111

(22) Filed: Nov. 30, 2017

(65) Prior Publication Data

US 2019/0165251 A1    May 30, 2019

(51) Int. Cl.
*H10N 30/05* (2023.01)
*H10N 30/01* (2023.01)
*H10N 30/045* (2023.01)
*H10N 30/06* (2023.01)
*H10N 30/074* (2023.01)
*H10N 30/098* (2023.01)
*H10N 30/857* (2023.01)

(52) U.S. Cl.
CPC ............ *H10N 30/05* (2023.02); *H10N 30/01* (2023.02); *H10N 30/045* (2023.02); *H10N 30/06* (2023.02); *H10N 30/074* (2023.02); *H10N 30/098* (2023.02); *H10N 30/857* (2023.02)

(58) Field of Classification Search
CPC ....... H01L 41/22; H01L 41/257; H01L 41/27; H01L 41/314; H01L 41/29
See application file for complete search history.

(56) References Cited

U.S. PATENT DOCUMENTS

| 3,985,914 | A | * | 10/1976 | Sasaki | H10N 30/098 427/457 |
| 4,079,437 | A | | 3/1978 | Sheffield | |
| 4,340,786 | A | * | 7/1982 | Tester | H10N 30/098 428/209 |
| 4,500,377 | A | * | 2/1985 | Broussoux | H10N 30/098 84/DIG. 24 |

(Continued)

FOREIGN PATENT DOCUMENTS

| CN | 102803357 | 11/2012 |
| CN | 103097105 | 5/2013 |

(Continued)

*Primary Examiner* — Jeffrey T Carley
(74) *Attorney, Agent, or Firm* — Riverside Law LLP

(57) ABSTRACT

The disclosure is and includes at least an apparatus, system and method for manufacturing piezoelectrics. The apparatus, system and method may include at least a first roller and an end roller; a continuous printable substrate roll extending at least from the first roller to the end roller as the first and end roller turn; at least one printer for printing piezoelectric material onto the continuous substrate roll to form a plurality of the piezoelectrics; and an electric field generator that polls the piezoelectric material as the continuous substrate roll is rolled from the first roller to the end roller. The polling electric field generator may comprise a corona field generator.

9 Claims, 4 Drawing Sheets

(56) References Cited

U.S. PATENT DOCUMENTS

| | | | | |
|---|---|---|---|---|
| 4,557,880 A * | 12/1985 | Pantelis | H01L 41/45 | 264/435 |
| 4,734,228 A * | 3/1988 | Micheron | H01L 41/257 | 264/10 |
| 5,045,747 A * | 9/1991 | Chen | H01L 41/257 | 310/357 |
| 7,216,417 B2 * | 5/2007 | Raisanen | A61B 5/113 | 310/317 |
| 10,232,641 B2 * | 3/2019 | Yamada | F26B 3/34 | |
| 2005/0015175 A1 * | 1/2005 | Huang | B33Y 30/00 | 700/121 |
| 2010/0181871 A1 * | 7/2010 | Daniel | G01L 1/16 | 310/338 |
| 2011/0004102 A1 | 1/2011 | Morita | | |
| 2011/0021916 A1 * | 1/2011 | Morita | C08G 18/3814 | 29/25.35 |
| 2011/0061216 A1 * | 3/2011 | Yamada | B41J 2/1612 | 29/25.35 |
| 2013/0312809 A1 * | 11/2013 | Luch | H01L 31/022425 | 136/244 |
| 2014/0145562 A1 * | 5/2014 | Siores | B29C 48/04 | 310/339 |
| 2015/0034237 A1 * | 2/2015 | Biggs | H01L 41/047 | 156/234 |
| 2016/0016369 A1 * | 1/2016 | Tarbutton | B29C 64/106 | 264/435 |
| 2017/0070204 A1 * | 3/2017 | McIntyre | H03H 9/02275 | |
| 2017/0114241 A1 | 4/2017 | Almadhoun | | |
| 2017/0172421 A1 * | 6/2017 | Dabby | G06F 3/011 | |
| 2017/0225447 A1 | 8/2017 | Varadan | | |

FOREIGN PATENT DOCUMENTS

| | | |
|---|---|---|
| CN | 106575575 | 4/2017 |
| CN | 107336524 | 11/2017 |
| JP | 2539428 | 10/1996 |
| KR | 101429542 | 8/2014 |
| KR | 20140097875 | 8/2014 |
| KR | 20170081872 | 7/2017 |

* cited by examiner

SYSTEM FOR MANUFACTURING PIEZOELECTRONICS

BACKGROUND

Field of the Disclosure

The disclosure relates generally to piezoelectronics and, more particularly, to an apparatus, system and method for manufacturing piezoelectronics.

Background of the Disclosure

Piezoelectric transducers are well understood in the art to generate an electrical signal responsive to a mechanical movement or stress, or conversely, to generate a mechanical movement or stress responsive to an electrical signal. Piezo-material, which provides the active layer of a typical piezo transducer, is generally manufactured using a casting process. In its native state, a typical cast piezoelectric material is composed of large numbers of microscopic electric dipoles which possess a random orientation, thereby rendering the overall polarization of the piezoelectric material at zero. When stressed, a piezoelectric material having a zero overall polarization will react to a mechanical force with only a very small response, and thereby with only a very weak piezoelectric effect. Consequently, in order to enhance the responsiveness of the piezoelectric sensitive material, the native dipoles of the material must be initially oriented in the direction of prospectively applied forces. This process of forcing the dipoles to orient in a uniform direction is called "polling".

Batch process polling is typically implemented by applying a very strong electrical field to the piezo materials in the prescribed direction for a sufficient time period. After the removal of the electric field, the majority of dipoles in the piezo electric material will remain in a particular orientation. As such, the process of polling piezoelectric materials is similar to the magnetization of magnetic material, wherein one applies a sufficiently large magnetic field to align the internal magnetic dipole moments of the magnetic material.

Batch process polling suffers from a significant drawback, at least in that only a single "batch" of piezo material is exposed to the polling process at a given time. That batch, once polled, must be removed from the batch process, and then a new batch of piezo material is inserted into the polling process, exposed to the polling electric field, and removed from the process, and so on for each processed batch. Accordingly, batch processes increase production time, minimize throughput, and negatively impact cost efficiency due to the need to have a start time, end time, and down time before and during each batch process.

Piezoelectric transducers may be used in a variety of circumstances. For example, piezo sensors may be used for monitoring and actuation, such as for the monitoring of heartbeats, sleep quality, flow control, the providing of ultrasounds, healthcare aspects, temperature, force, vibration, hydration, balance, flow, and the like. Piezo sensors may also be used to provide human machine interfaces and interface haptic feedback, such as instead of capacitive touch technology, may be used to provide embedded haptic feedback, to provide virtual reality interfacing, to provide grip sensing, tactile sensing, pressure sensing, and the like. Piezo transducers may also allow for energy harvesting, such as to power bile implantable sensors, and may be used to provide autonomous sensors or to harvest energy to provide lighting, and may be used in conjunction with the Internet of things, to provide micro-power generation, self-powered medical devices, wireless sensor networks, accelerometer and gyroscopic sensors and harvesters, or may be used to replace batteries, and the like.

Piezo transducers may also be used in manufacturing settings, such as to provide machines, sensors, engineering retooling, grip monitoring, or to provide wearable sensors for manufacturing, and in many other manufacturing settings, in part due to the small, thin, flexible and durable nature of piezo transducers. Piezoelectrics may also provide enhancements to acoustics and audio technology, such as through the providing of thin film speakers and headphones, compact and flexible audio devices, high resolution ultrasound imaging (such as may operate at 20-50 MHz), microphones and acoustic sensors for control and voice recognition, autonomous audio sensors, and the like. Of course, all of the foregoing and myriad other technologies, such as prosthetics, may benefit from the use of piezoelectrics due to the thin, durable nature of piezo electrics, and the lack of necessity for a piezoelectric to receive external power. However, the level of usefulness of piezo electrics in all of the foregoing arenas is limited in the known art due to the inefficiency of manufacture of piezoelectronics which results, in part, because of the need for the aforementioned batch polling processes.

Therefore, the need exists for an apparatus, system and method of more efficiently manufacturing piezoelectrics.

SUMMARY

The disclosure is and includes at least an apparatus, system and method for manufacturing piezoelectric transducers. The apparatus, system and method may include at least a first roller and an end roller; a continuous printable substrate roll extending at least from the first roller to the end roller as the first and end roller turn; at least one printer for printing piezoelectric material onto the continuous substrate roll to form a plurality of the piezoelectrics; and an electric field generator that polls the piezoelectric material as the continuous substrate roll is rolled from the first roller to the end roller. The polling electric field generator may comprise a corona field generator.

The method of roll-to-roll printing of piezoelectrics may particularly include: printing, via at least three print layers, the piezoelectrics onto the roll, each of the piezoelectrics comprising at least one dielectric layer, at least two conductive layers, and at least one piezomaterial layer; and substantially continuously exposing the printed roll to an electric field in order to poll the piezomaterial layer.

Thus, the disclosure provides an apparatus, system and method of more efficiently manufacturing piezoelectrics.

BRIEF DESCRIPTION OF THE DRAWINGS

The disclosure is illustrated by way of example and not limitation in the accompanying drawings, in which like references indicate similar elements, and in which.

DETAILED DESCRIPTION

Figure 1:
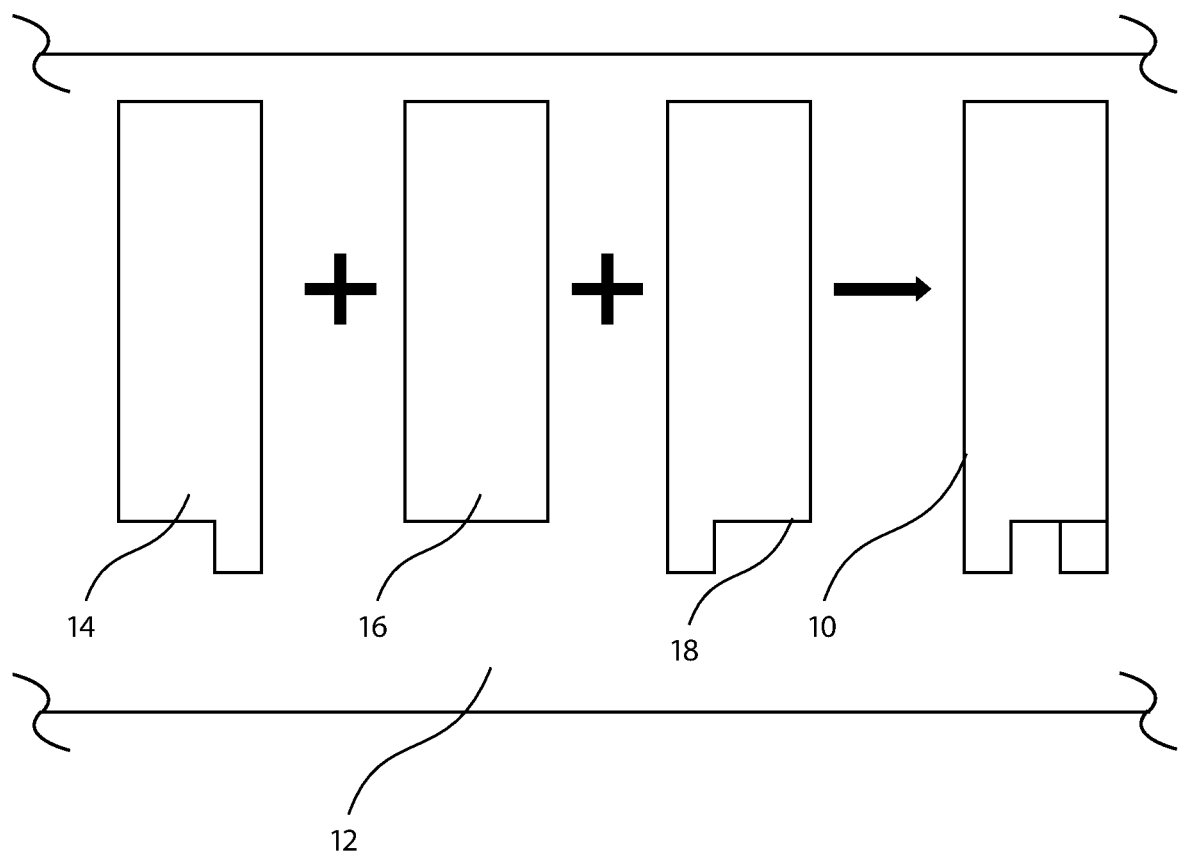
FIG. 1 illustrates an embodiment of a printed piezoelectronic circuit.

The figures and descriptions provided herein may have been simplified to illustrate aspects that are relevant for a clear understanding of the herein described devices, systems, and methods, while eliminating, for the purpose of clarity, other aspects that may be found in typical similar devices, systems, and methods. Those of ordinary skill may recognize that other elements and/or operations may be desirable and/or necessary to implement the devices, systems, and methods described herein. But because such elements and operations are well known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc., may be used herein to describe various elements, components, regions, layers and/or sections, these elements, components, regions, layers and/or sections should not be limited by these terms. These terms may be only used to distinguish one element, component, region, layer or section from another element, component, region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the exemplary embodiments.

The embodiments include piezoelectrics provided, in part, using a continuous manufactured printing. The piezoelectric transducers may be poled using in-line polling, such as corona polling, by way of non-limiting example. The printed transducer may include three or more separate functional layers, including conductive layers, piezo active layers, and dielectric layers.

More particularly, the disclosed piezoelectric transducer may be comprised of an active piezo material (such as a polymer or other piezo material) layer that is sandwiched between two conductive layers. More particularly, and as referenced above, continuous corona polling may be used to activate the electro-active effect of the piezo material. This is in contrast to prior art embodiments, in which polling is done using high-voltage batch processes.

Corona discharge is a partial breakdown of air, typically at atmospheric pressure, that may be initiated by a discharge in an inhomogeneous electric field. Corona discharge may be used to poll films of electro-materials, such as the disclosed piezo material, in order to enhance electronic properties, and is typically employed in opto electronics.

Although corona polling may be performed at room temperature, Corona polling at elevated temperatures may provide numerous advantages. For example, raising the temperature during polling may increase the mobility of electrons and molecules during the polling process, and the lowering of temperature from the elevated temperature to well below the transition temperature at a distinct breaking point may "freeze" electrons and molecules in the new orientation to be provided by the corona polling.

Piezoelectric films having optimized piezo properties may be continuously formed in the embodiments. Specifically, the piezo circuits in the embodiments may be printed on a substrate in a roll-to-roll fashion, and corona polling may be performed when the roll of printed material is exposed to a continuous electric field, such as in a heated or unheated environment. Accordingly, corona polling may be used to fabricate the printed piezoelectric transducers efficiently, continuously, and without the batch polling processes known in the art.

Of note, the polling employed in roll-to-roll processing may be used to create a specific and characteristic "$D_{33}$" signature. A $D_{33}$ signature is an industry recognized descriptive piezoelectric performance parameter that quantifies the volume change when a piezo electric material is subject to an electric field, or the polarization of a piezo electric material upon application of a stress. This parameter obeys the equation $d=p/\sigma$, where p is polarization and $\sigma$ is the stress factor.

Of note, the corona polling continuous electric field may be provided distinctly from the printing process, or may be provided as part of the printer or printing process. For example, one or more aspects of a 3D printer used in the piezo material printing process may be charged to form an anode, while another portion of the 3D printer, or the continuous printing substrate itself or the receiving surface on which the substrate "rolls" may be charged as a cathode, such that polling occurs to the printed material as it is laid onto the substrate.

Additionally and alternatively, the print material may be printed on a continuous substrate roll, such as by one or a series of printers, printing, different substances. As the print roll is printed, the roll may continuously pass through an electric field to perform a corona polling process in a continuous manner. As will be understood, either of the foregoing continuous corona processes may be performed at room temperature or at elevated temperature and, to the extent performed at elevated temperature, may include within the print process a substantially instantaneous drop in temperature in order to "freeze" the polling of the piezo material, as discussed above.

More particularly, the piezo material discussed throughout may be any printable piezo material known to those skilled in the art, such as polyvinylidene fluoride polymer (PVDF). For example, an fluro-polymer PVDF-TRFE based ink, such as ink formulated by Solvay, may provide the piezo material layer.

PVDF material may be deposited, such as on a conductive layer, such as a silver layer, as discussed herein, in a live print mode. Thereafter or prior to the foregoing prints, additional layers may be printed to form piezoelectrics, and the corona polling process may be performed at any stage once the piezo material has been printed. Alternatively, the disclosed embodiments may be operable using a previously printed roll of printed piezo, conductive, and dielectric material that is then rolled, such as in a roll-to-roll fashion, through the polling process. As discussed herein, the embodiments may include continuous, noncontact corona polling, although the skilled artisan will appreciate in light of the discussion herein that contact based or batch process polling may be similarly employed.

More particularly, PVDF may be used as a piezo material in the embodiments because it is printable, and is regarded as a tough material, a stable material, and hence provides distinct engineering advantages in the embodiments. For example, printed PVDF may withstand exposure to various harsh thermal, chemical, or ultraviolet conditions, such as may be necessary to print and poll the disclosed piezoelectrics. That is, PVDF is of low weight, low thermal conductivity, high chemical resistance, high heat resistance, high mechanical strength, high abrasion resistance, low permeability, and provides various other material benefits that will be apparent to the skilled artisan.

As referenced, the piezomaterial may be printed onto one or more other layers, which may form or be printed atop a substrate. More specifically, the conductive, piezo, and dielectric layers discussed herein may be printed onto one or more substrates, such as a polyethylene terephthalate substrate (PET) or Mylar substrate, of any of various thicknesses, such as PET having a thickness in the range of 2 mils to 10 mils. Such print processes will readily allow for the continuous polling process disclosed throughout.

The embodiments disclosed throughout may be printed and polled using a roll-to-roll type coating and printing technique, which decreases production time, augments throughput, and enhances cost efficiency in the manufacture of piezoelectric transducers. Such a complete roll-to-roll (R2R) fabrication of piezoelectric transducers allows for continuous exposure of the roll in an in-line, noncontact polling process, such as a corona polling process. Thereby, the embodiments may drastically reduce the manufacturing time of discrete piezo electric sensors, at least by eliminating the need for human intervention at process stages, and eliminating the need for polling of the piezoelectrics in batches. The aforementioned improved manufacturing more readily enables penetration of piezoelectric sensors into the various market segments discussed herein, at least because of the avoidance of piezoelectrics having prohibitive manufacturing costs.

FIG. 1 illustrates an exemplary piezo electric transducer 10 printed on a substrate roll 12 in accordance with the embodiments. As illustrated, a bottom electrode of conductive ink 14 is printed and receives, printed thereupon, one or more piezo layers 16, such as a PVDF layer, by way of nonlimiting example. Printed atop the conductive layer is a top electrode 18, which results in the finished printed sensor shown in FIG. 1.

Figure 2:
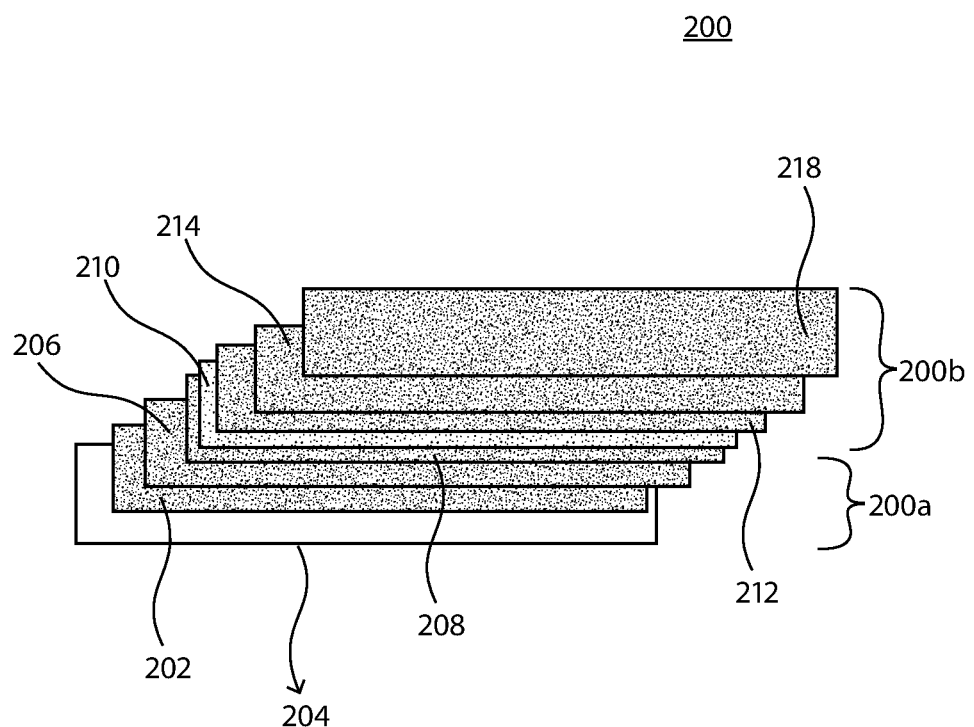
FIG. 2 illustrates an embodiment of a printed piezoelectronic circuit.

FIG. 2 illustrates an alternative embodiment in which piezoelectronic circuits 200 include multiple piezo layers which may be printed using the disclosed processes. In the illustration, a first conductive electrode 1 202 is printed on a substrate 204, and printed thereupon is printed a first piezo layer 206, PVDF layer 1. This PVDF layer 1 206 then receives thereupon a printed conductive electrode 2 208, which has printed thereupon a dielectric 210, i.e., substantially nonconductive, layer of a printable dielectric ink, as will be understood to the skilled artisan. Thereafter, conductive electrode 3 212 is layered upon the dielectric layer 210, PVDF layer 2 214 is layered upon conductive electrode 3 212, and conductive electrode 4 218 is printed atop PVDF layer 2 214. This results in dual piezo sensors 200a, 200b that may be kept electrically distinct, or which may be electrically connected, in certain circumstances, based on the presence of the dielectric layer between conductive electrode 2 and conductive electrode 3. The skilled artisan will appreciate that other piezo material layers may be used in the embodiments—that is, PVDF layers are used in the foregoing discussions by way of non-limiting example only.

Figure 3:
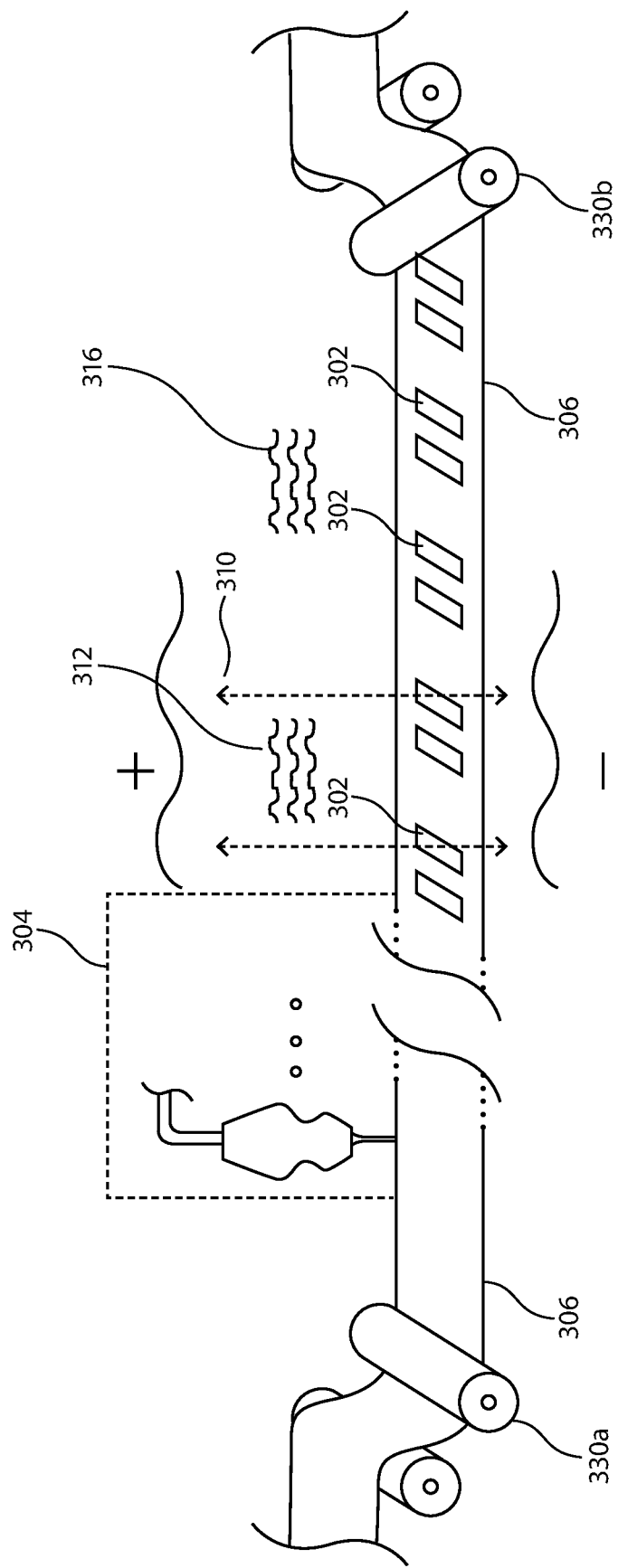
FIG. 3 illustrates an exemplary manufacturing system for printed piezoelectronic circuits.

FIG. 3 is a manufacturing system 300 diagram. In the illustration, the piezoelectric circuits 302 of FIGS. 1 and 2 are continuously printed, via a series of manufacturing prints 304, onto a continuous substrate roll 306. As illustrated, as the roll 306 is continuously rolled, at least from at least start roller 330a to at least an end roller 330b, through a polling electric field 310. In the illustration, the polling process 310 is performed at ambient temperature 312, although, as referenced throughout, the polling process may be performed in the presence of an elevated temperature 312. In an elevated temperature embodiment, also included in the continuous print example illustrated may be a low(er) temperature chamber or pseudo-chamber employed as a cooler 316 to cool the roll after polling, in which the temperature of the piezomaterial may be drastically decreased in a relatively short time frame, such that the polling of the piezomaterial is "frozen".

Figure 4:
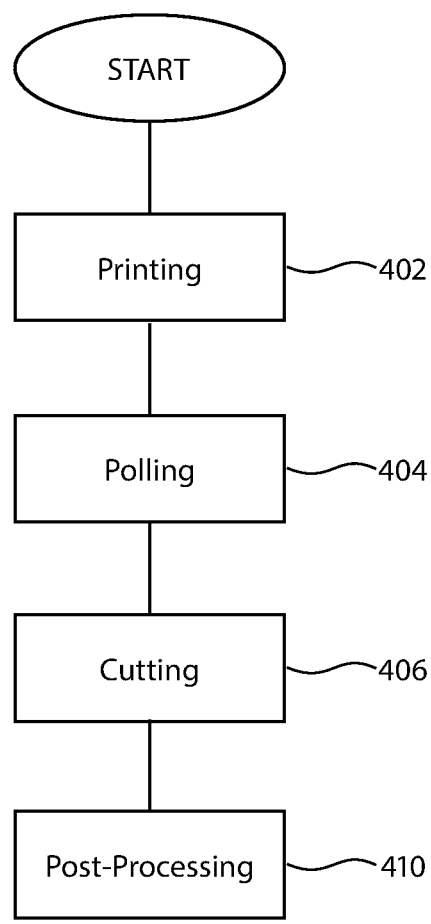
FIG. 4 illustrates a method of manufacturing piezoelectrconics.

FIG. 4 is a flow diagram for a roll-to-roll printing process for manufacturing piezoelectrics in accordance with the embodiments. At step 402, a series of printers, which may include at least conductive ink printers, dielectric printers, and a piezo material printer may be employed to print, in series and continuously along a continuous rolling substrate, at least one piezoelectric circuit, such as one of the piezo circuits illustrated hereinabove in FIGS. 1 and 2. During or following the printing processes, the continuous roll is exposed to an electric field in order to perform a polling process, such as a corona polling process, at step 404. At step 406, the printed and polled piezo circuits may be cut from the roll into independent circuits for packaging. As understood to the skilled artisan, the independent circuits may be exposed to various additional postproduction processes and/or packaging, by way of nonlimiting example, at step 410.

In the foregoing Detailed Description, it can be seen that various features are grouped together in a single embodiment for the purpose of streamlining the disclosure. This method of disclosure is not to be interpreted as reflecting an intention that the embodiments require more features than are expressly recited herein. That is, the recited embodiments are provided by way of example only, and the disclosure encompasses any embodiments having more or fewer elements than the exemplary embodiments which will be apparent to the skilled artisan in light of the discussion herein.

What is claimed is:

1. A system for manufacturing piezoelectrics, comprising:
at least a first roller and an end roller;

a continuously advancing printable substrate roll extending at least from rotating ones of the first roller to the end roller, wherein the substrate is part of the piezoelectrics;

at least one printer adapted to continuously print piezoelectric ink material onto the continuously advancing printable substrate roll to thereby form a plurality of the piezoelectrics;

an electric field generator configured to supply an electric field to the piezoelectric ink material at a first temperature, wherein the electric field generator is configured to poll the piezoelectric material as the continuously advancing substrate roll is rolled from the first roller to the end roller; and a cooler comprising a low temperature chamber or pseudo-chamber, the cooler being configured to drive the piezoelectric ink material at the first temperature to a second temperature below the first temperature, the cooler being positioned to cool the piezoelectric ink material immediately following the polling via the electric field generation to freeze the polling of the piezoelectric ink material.

2. The system of claim 1, wherein the polling electric field generator generates a corona field.

3. The system of claim 1, wherein the plurality of the piezoelectrics which the at least one printer is adapted to print further comprises at least two conductive layers having the piezoelectric ink material therebetween, and at least two dielectric layers printed on the at least two conductive layers.

4. The system of claim 1, wherein the piezoelectric ink material which the at least one printer is adapted to print comprises an electro active polymer.

5. The system of claim 4, wherein the polymer comprises polyvinylidene fluoride polymer.

6. The system of claim 1, wherein the at least one printer comprises at least a piezoelectric ink material printer, at least one dielectric ink material printer, and at least one conductive material printer.

7. The system of claim 1, wherein the substrate comprises a flexible substrate.

8. The system of claim 7, wherein the flexible substrate has a thickness in the range of 2 mils to 10 mils.

9. The system of claim 1, wherein the printed and polled piezoelectrics are configured to be cut from the substrate roll.

* * * * *